United States Patent [19]
Hyodo

[11] Patent Number: 4,926,072
[45] Date of Patent: May 15, 1990

[54] NOISE ELIMINATION CIRCUIT

[75] Inventor: Hitoshi Hyodo, Okazaki, Japan

[73] Assignee: Aisin Seiki Kabushikikaisha, Aichi, Japan

[21] Appl. No.: 245,189

[22] Filed: Sep. 16, 1988

[30] Foreign Application Priority Data

Sep. 18, 1987 [JP] Japan ................. 62-234248
Sep. 18, 1987 [JP] Japan ................. 62-234249

[51] Int. Cl.$^5$ .................. H03K 5/01; H03K 17/16
[52] U.S. Cl. .................. 307/542.1; 307/471; 377/114
[58] Field of Search .................. 307/471, 542.1; 377/114

[56] References Cited

U.S. PATENT DOCUMENTS 4,028,560  6/1977  Bainter ................. 307/542.1

FOREIGN PATENT DOCUMENTS 56-48714  5/1981  Japan ................. 307/542.1
56-85929  7/1981  Japan ................. 307/542.1
60-62227  4/1985  Japan ................. 307/542.1
62-36571  6/1987  Japan ................. 307/542.1

OTHER PUBLICATIONS

"Dictionary of Patented Pulse Circuit Technology", Chpt. 14 w/partial translation.

Primary Examiner—John S. Heyman
Attorney, Agent, or Firm—Sughrue, Mion, Zinn, Macpeak & Seas

[57] ABSTRACT

The level of a noise removed signal which is currently delivered is compared against the level of an input signal to be detected. If the non-coincidence therebetween continues over a given time interval, the level of the noise removed signal is inverted. In this manner, noises having stable levels which do not last over the given time interval are removed, thus deriving a favorable noise removed signal. In an alternative form, the level of a noise removed signal which is currently delivered is compared against the level of an input signal to be detected. When there is a non-coincidence therebetween which lasts over a first given time interval, when there is a coincidence which lasts over a second given time interval and when a third given time interval or more has passed, a noise removed signal is inverted. In this manner, a noise removed signal is obtained from which noises having a stable level which lasts less than the first given time interval, which occur sporadically or which fluctuate with relatively long periods are removed.

3 Claims, 4 Drawing Sheets

NOISE ELIMINATION CIRCUIT

BACKGROUND OF THE INVENTION

The invention relates to a circuit for eliminating noises contained in a signal, for example, to a noise elimination circuit which removes chattering noises which are included in an output signal from a switch having a mechanical contact or sensor.

Various forms of noise elimination circuits are disclosed in Chapter 14 "Elimination of Noises and Detection of Signal" of a book entitled "Dictionary of Patented Pulse Circuit Technology" edited by Suzuki and Higuchi and published from OHM-Sha.

A most fundamental form utilizes C-R circuit, which suffers from a large variation in the error. Recently, an arrangement is utilized in a microcomputer or the like which removes chattering noises by a software processing. However, this involves a disadvantage that the microcomputer cannot be used to perform other operations because it is busy with the elimination of noises. This is inconvenient particularly when a high speed processing operation is desired.

When removing noises from a signal derived from a sensing device as used in a microcomputer or the like, a read timing is established by means of a clock pulse. Hence it is desirable to perform the elimination of noises in synchronism with such clock pulse. One form of an arrangement which eliminates noises in synchronism with a clock pulse is disclosed in Japanese Patent Publication No. 36,571/1987, the claim of which reads as follows:

"An apparatus for detecting a signal depending on a rotational speed used to control a rotational speed and for shaping it into and delivering it as a pulse signal; comprising a clock input terminal which receives a rotation detection signal; a clock input terminal which receives a reference clock signal; coincidence detection means having its one input terminal connected to the input terminal which receives the rotation detection signal; an R-S flipflop having its set input terminal connected to an output terminal of the coincidence detection means; a counter circuit connected to the clock input terminal and to an output terminal of the R-S flipflop for counting a predetermined number of reference clock signals when the R-S flipflop is set to deliver a trigger pulse to a reset terminal of the R-S flipflop; a flipflop circuit having its input terminal connected to an output terminal of the counter and having its output terminal connected to the other input terminal of the coincidence detection means for inverting the state of an output level each time the trigger pulse is input thereto; and a rotation detection signal output terminal connected to an output terminal of the flipflop circuit to deliver a signal from which noises are eliminated."

In this arrangement, a rotation detection signal which is used to perform a control over the rotational speed is chosen to be a sinusoidal wave, and it is assumed that noises occur around a zero crossover point. The signal is shaped into a pulse form while it includes noises. Several noise pulses are present adjacent to the rising and falling edges of the shaped signal. Of these, the first pulse is detected, and is utilized to derive a rotation detection pulse from which noise pulses are removed.

However in the noise elimination circuit described, if noises occur in the vicinity of a peak of the rotation detection signal which is assumed to be a sinusoidal wave, the flipflop responds thereto to invert its output, resulting in a failure to remove the influence of noises.

Therefore, it is an object of the invention to provide a noise elimination circuit which eliminates noises accurately by a digital processing of a signal without requiring an increased demand upon the software.

SUMMARY OF THE INVENTION

The above object is accomplished in accordance with a first aspect of the invention by providing a noise elimination circuit comprising inverted output means responsive to an inversion command signal to invert the level of an output signal; decision means receiving an output signal from the inverted output means and an input signal to be detected and producing a coincidence signal whenever the signals coincide in their level and producing a non-coincidence signal whenever the signals have different levels; and time limit means for determining a time interval during which the decision means produces a non-coincidence signal and for producing an inversion command signal transmitted to the inverted output means whenever the time interval determined becomes equal to a given length of time, thereby providing an output signal from the inverted output means as a signal from which noises are removed.

With this arrangement, if the level of an input signal to be detected changes, the inverted output means do not change the level of an output signal therefrom if the changed level is not maintained over a given time interval, thus removing noises which fluctuates with relative short periods, thus deriving a signal from which noises are removed in a favorable manner.

In accordance with a second aspect of the invention, there is provided a noise elimination circuit comprising inverted output means responsive to an inversion command signal to invert the level of an output signal therefrom; decision means receiving an output signal from the inverted output means and an input signal to be detected and producing a coincidence signal whenever the both signals coincide in their level and producing a non-coincidence signal whenever the signals have different levels; first time limit means for determining a length of time during which the decision means produces a non-coincidence signal and for delivering a first time-over signal when the length of time determined reaches a first given time interval; second time limit means for determining the length of time during which the decision means produces a coincidence signal and for delivering a second time-over signal when the length of time determined reaches a second time interval; third time limit means for determining a length of time which passes since the decision means produces a non-coincidence signal, for initializing the second time limit means as the latter delivers the second time-over signal and for delivering a third time-over signal whenever the length of time determined becomes equal to a third time interval; and inversion command means for delivering an inversion command signal applied to the inverted output means when the first time limit means delivers the first time-over signal and the third time limit means delivers the third time-over signal, thereby providing an output signal from the inverted output means as a signal from which noises are removed.

With this arrangement, in the presence of a fluctuation in the level of an input signal to be detected, an output signal from the inverted output means does not change its level if the time duration of a stable level which the input signal assumes is less than the first given time interval and when the period of such fluctuation is greater than the second time interval, thereby allowing a portion of the input signal to be detected which has a stabilized level to be extracted, thus providing a signal from which noises are removed in a favorable manner.

Other objects and features of the invention will become apparent from the following description of embodiments thereof with reference to the drawings.

DESCRIPTION OF EMBODIMENTS

Figure 1:
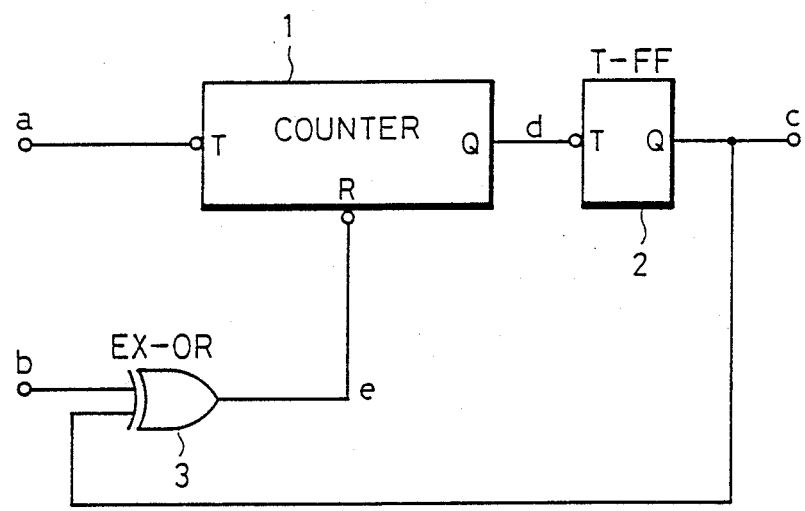
FIG. 1 is a block diagram of a noise elimination circuit according to a first embodiment of the invention.
Figure 2:
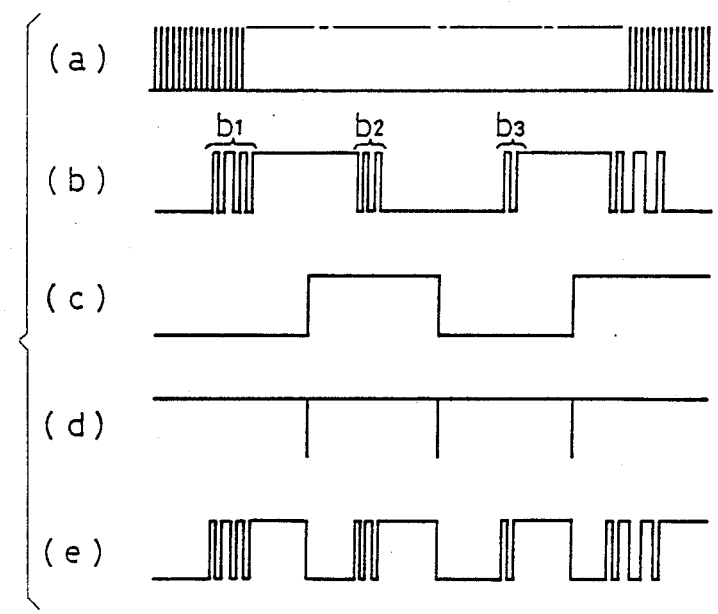
FIG. 2 is a series of timing charts illustrating examples of signals appearing in various parts of the noise elimination circuit shown in FIG. 1.

Referring to FIGS. 1 and 2, a first embodiment of the invention will now be described. In this embodiment, a noise elimination circuit comprises a counter 1 which may be formed by a binary counter and a shift register, a T-type flipflop 2 and an exclusive OR gate 3.

The counter 1 counts a clock pulse a applied to a count input terminal T and produces an over-count signal d at its output terminal Q. Specifically, a count in the counter 1 is cleared by a reset signal e applied to its reset input terminal R, or a negative edge of an output signal from the gate 3, and then establishes an L level (low level) for the over-count signal d. As long as the reset signal e remains at its H level (high level), the count is triggered by a positive edge of the clock pulse a, thus incrementing the count therein until the count reaches a given value, whereupon the over-count signal d changes to its L level. The over-count signal d is applied to the flipflop 2.

The flipflop 2 is triggered by a negative edge of the over-count signal d applied to its input terminal T, thereby inverting an output signal c at its output terminal Q. The output signal c is fed back to one input of the gate 3.

The other input to the gate 3 represents an input signal b to be detected which contains noises. When the both inputs match, it provides an output signal of L level, but the gate produces an output signal of H level in response to a mismatch. In the present embodiment, it is assumed that the data content of the input signal b is represented by its H level (thus, in the absence of data content, the input signal b assumes its L level).

This output represents the reset signal e mentioned above. In this manner, the counter 1 is reset upon each coincidence between the output signal c from the flipflop 2 and the input signal b. Accordingly, the output signal c from the flipflop 2 which is triggered by the over-count signal d delivered by the counter 1 represents a noise eliminated signal which is obtained by removing from the input signal b noises in which the time duration of a stable status does not reach the over-count period of the counter 1 (namely, the time period during which the counter 1 counts a given number of clock pulses a).

Referring to FIG. 2, this aspect will now be more specifically described in terms of a specific example. In the absence of any oncoming input signal b to be detected, the circuit is in its stable condition while delivering a signal c of L level from which noises are removed as an output. This can be explained as follows: By way of example, suppose that the flipflop 2 delivers a signal c of H level from which noises are removed as an output under an instable condition as when the power is initially turned on. In the absence of any oncoming input signal b to be detected, the gate 3 delivers the reset signal e of H level, allowing the counter 1 to initiate counting the clock pulse a. The count in the counter 1 eventually reaches a given value, whereupon the over-count signal d is delivered, whereby the flipflop 2 changes the signal c to its L level. Accordingly, the gate 3 changes the reset signal e to its L level, thereby resetting the counter 1, which therefore ceases to count subsequent clock pulses. Thus, the circuit is stable while delivering the signal c of L level.

Suppose now that chattering components b1, b2, b3 ... which fluctuate with periods less than the over-count period as well as the input signal b to be detected containing data content having a stable condition over a time interval greater than at least the over-count period are oncoming as illustrated in FIG. 2.

Initially, in response to the oncoming chattering component b1, the gate 3 delivers the reset signal e which is equivalent thereto since the flipflop 2 delivers the output signal c of L level. Because the reset signal e fluctuates with a period which is sufficiently shorter than the over-count period, the counter 1 is cleared at each alternation by the negative edge, and the count therein cannot reach the given value.

Subsequently when the chattering component b1 disappears and data content of H level is oncoming, the gate 3 changes the reset signal e to its H level. Since the stable condition of the data content continues over a time interval which exceeds the over-count period, the count in the counter 1 eventually reaches the given value. The counter 1 then changes the over-count signal d to its L level, as mentioned previously, and in response thereto, the flipflop 2 changes the output signal c to its H level. This causes the gate 3 to change the reset signal e to its L level, thus resetting the counter 1, which therefore ceases to count the clock pulse a. Since the over-count signal e changes to its H level as the counter 1 is reset, it follows that the over-count signal d represents a short pulse as shown in FIG. 2.

The stable condition of data content is followed by a chattering component b2 which is then oncoming. Since the output signal c from the flipflop 2 which prevails is at its H level, the gate 3 delivers the reset signal e which is equal to an inverted chattering component b2. Because the reset signal e again fluctuates with a period which is sufficiently shorter than the over-count period, a count in the counter 1 cannot reach the given value, whereby the output signal c from the flipflop 2 is maintained at its H level.

Subsequently, when the chattering component b2 disappears and data content of L level is oncoming, the gate 3 changes the reset signal e to its H level. As a result of the reset signal e changing to its H level, the counter 1 is enabled to initiate counting the clock pulse a, and when the count reaches the given value, the over-count signal d is changed to its L level generally in the similar manner as mentioned previously. The flipflop 2 now changes the output signal c to its L level, but since the data content is at its L level, the reset signal e from the gate 3 is again changed to its L level to reset the counter 1, which therefore ceases to count the clock pulse a.

A similar operation is subsequently repeated, and the output signal c from the flipflop 2 represents a signal from which noises, which fluctuates with periods less than the over-count period, are removed. In other words, the circuit of the present embodiment is effective to extract only those components having a stable condition over a continued time interval which is equal to or greater than the over-count period. The given value mentioned above at which the counter 1 provides an over-count may be chosen to be equal to a time interval since the initiation of counting the clock pulse a until the over-count is delivered, or to be equal to a time interval which is sufficient to enable the over-count period to provide a discrimination between noise components such as caused by a chattering and data content, but can be chosen at will depending on the characteristic of the input signal b to be detected.

In the described embodiment, various elements may be modified. By way of example, the counter 1 may be replaced by a frequency divider circuit; the T-type flipflop 2 may be replaced by an R-S type flipflop. Alternatively, the exclusive OR gate 3 may be replaced by logic elements such as flipflops. At any event, any element functioning to count a clock pulse and which can be reset may be substituted for the counter 1, and any element which is capable of inverting an output in response to each input can be substituted for the T-type flipflop 2, and any element which is capable of determining a coincidence/non-coincidence can be substituted by the exclusive OR gate 3. Alternatively, the functioning of the T-type flipflop 2 and the exclusive OR gate 3 may be performed by a microcomputer.

Figure 3:
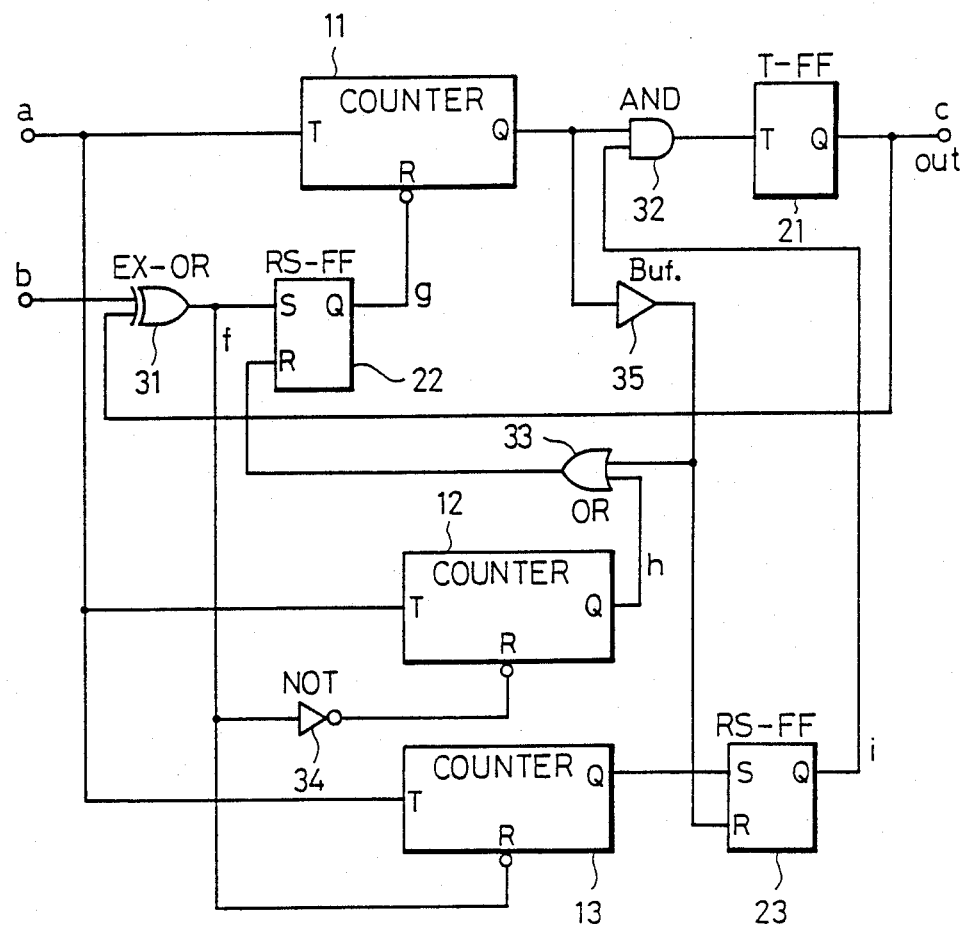
FIG. 3 is a block diagram of a noise elimination circuit according to a second embodiment of the invention.
Figure 4:
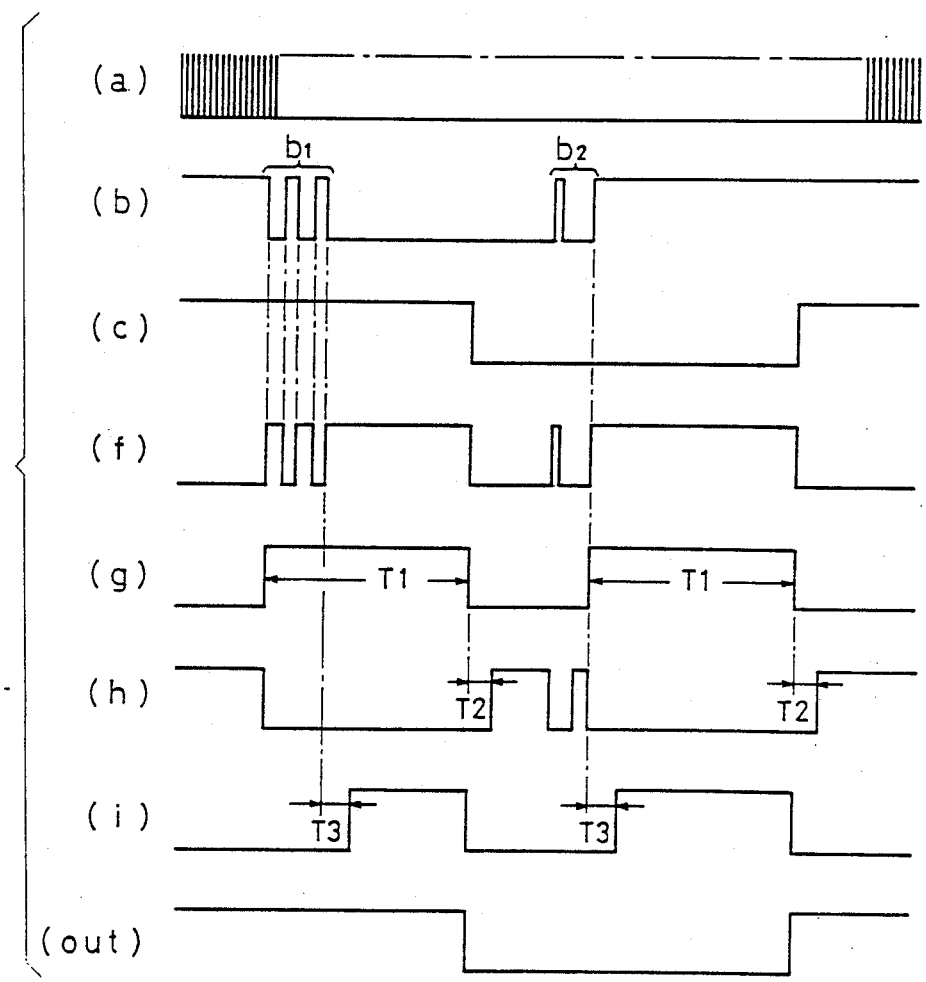
FIG. 4 is a series of timing charts illustrating examples of various signals appearing in the noise elimination circuit shown in FIG. 3.

Referring to FIGS. 3 and 4, a second embodiment of the invention will now be described. In this embodiment, a noise elimination circuit comprises counters 11, 12 and 13, flipflops 21, 22 and 23, gates 31, 32 and 33, an inverter 34 and a delay buffer 35.

The counters 11 to 13 are constructed in a similar manner as the counter 1 used in the first embodiment. Specifically, each counter is cleared by a negative edge of a signal which is applied to its reset input terminal R. Each counter counts up in response to a positive edge of a clock pulse a which is input to a count input terminal T when the terminal R assumes its H level, and changes an output from its L to its H level in response to an over-count. The over-count of the counter 11 is chosen to be greater than that of the counter 13. (In the present embodiment, the counter 11 has an over-count period $T_1$ of about 1 m sec while the counter 13 has an over-count period $T_3$ of about 100 μsec.)

The flipflop 21 is a T-type flipflop similar to the flipflop 2 shown in the first embodiment, and is triggered by a positive edge of a signal which is applied to its input terminal T to invert an output signal c which is delivered at its output terminal Q. By contrast, the flipflops 22 and 23 are R-S type flipflops, which are mutually similar to each other. Specifically, each of these flipflops is triggered by a positive edge of a signal which is applied to its reset input terminal R to reset an output signal at its output terminal Q to its L level. The flipflop 22 or 23 is also triggered by a positive edge of a signal applied to its set input terminal S to deliver an output signal of H level at the output terminal Q.

The gate 31 represents an exclusive OR gate, which delivers a signal of L level in response to the coincidence of two inputs, and delivers a signal of H level in response to non-coincidence.

The gate 32 represents an AND gate while the gate 33 represents an OR gate. Since these gates and inverter 34 are well known in the art, they will not be described in detail. The delay buffer 35 is provided in order to stabilize the operation of the flipflop 23, and its functioning will be apparent from the following description:

An output from the counter 11 is applied to the gate 32 and the delay buffer 35. The other input of the gate 32 is fed from R-S flipflop 23, and its output is applied to the T-type flipflop 21. The output signal c from the flipflop 21 is fed back to one input of the gate 31, the other input of which is an input signal b to be detected which includes noises, in the similar manner as described in connection with the first embodiment. An output from the gate 31 is fed through the flipflop 22 to the reset terminal R of the counter 11, through the inverter 34 to the reset terminal R of the counter 12, and directly to the reset terminal R of the counter 13. An output from the counter 12 is fed to one input of the gate 33 and an output from the counter 13 is applied to the set input of the flipflop 23.

The delay buffer 35 feeds the other input of the gate 33 and the reset input of the flipflop 23. An output from the gate 33 is applied to the reset terminal R of the flipflop 22, and an output from the flipflop 23 is applied to the other input of the gate 32. In the present embodiment, it is assumed that data content of the input signal b to be detected is represented by its L level. (Thus, in the absence of data content, the input signal b assumes its H level.)

The operation of the noise elimination circuit will be specifically described with reference to FIG. 3 together with FIG. 4. In the absence of the input signal b to be detected, the circuit is in its stable condition while delivering the signal c of H level. This can be explained as follows: By way of example, assuming that the flipflop 21 delivers L level under an astable condition as when initially turning on the power, the absence of the input signal b causes the gate 31 to produce a signal f of H level, which sets the flipflop 22 to, allowing the counters 11 and 13 to initiate counting the clock pulse a. Subsequently, the counter 13 initially reaches its over-count to set the flipflop 23, thereby enabling the gate 32. Then the counter 11 reaches its over-count to trigger the flipflop 21 through the gate 32. (It will be noted that the counter 13 has an over-count period $T_3$ less than the over-count period $T_1$ of the counter 11.) In response thereto, the flipflop 21 changes its output signal to its H level, whereby the gate 31 changes its output signal f to its L level. On the other hand, immediately after triggering the flipflop 21, the output from the counter 11 is fed through the delay buffer 35 and the gate 33 to reset the flipflop 22, and is also fed through the delay buffer 35 to reset the flipflop 23. Accordingly, the counter 11 is reset, ceasing to count subsequent clock pulses. Thus, the gate 32 is disabled. Thus, it will be seen that the circuit is in its stable condition while delivering a signal c of H level.

It is now assumed that there is an oncoming input signal b to be detected which includes chattering components b'1, b'2, . . . which fluctuate with periods less than the over-count period $T_1$ (about 1 m sec) of the counter 11 as well as data component having a stable condition of duration greater than at least the over-count period $T_1$. Initially, in response to the chattering component b'1 which is oncoming, the gate 3 produces a signal f which is equivalent to an inversion thereof since the flipflop 2 delivers the output signal c of H level. Accordingly, when the signal f initially changes to its H level, the flipflop 22 is set, allowing the counter 11 to initiate counting the clock pulse a.

On the other hand, the counter 13 initiates counting the clock pulse a each time the output signal f from the gate 3 changes to its H level, or every time the input signal b to be detected changes to its L level as a result of a fluctuation of the chattering component b'1, but if the chattering component b'1 fluctuates with a period which is less than the over-count period $T_3$ (about 100 μsec) of the counter 13, the counter will be reset as the input signal changes to its L level, and hence cannot reach its over-count. However, when the chattering component b'1 ceases and data component of L level having a stable condition over an increased time duration is oncoming, the gate 3 continuously delivers the signal f of H level, allowing the counter 13 to reach its over-count to change its output to its H level, thus setting the flipflop 23 and enabling the gate 32.

Subsequently when the counter 11 reaches its over-count to change its output to its H level, such output is fed through the gate 32 to trigger the flipflop 21, changing its output signal c to its L level. It will be seen that the signal c is obtained by eliminating chattering component b'1 having a relatively short period from the input signal b to be detected.

When the signal c changes to its L level, the output signal f from the gate 3 changes to its L level, whereby the counter 13 is reset while the counter 12 is enabled to initiate counting the clock pulse a. Immediately thereafter, the output from the counter 11 which is delayed by the delay buffer 35 resets the flipflop 23 and disabled the gate 32, and is also fed through the gate 33 to reset the flipflop 22, thus resetting itself. Subsequently, the counter 12 reaches its over-count when its over-count period $T_2$ (which is assumed about 100 μsec) passes, changing its output signal h to its H level, but the circuit remains without change since the flipflop 22 is already reset.

It will be seen that the count 13 is effective to remove the influence of chattering components such as the chattering component b'1 which has relatively short periods, but the circuit is ineffective to remove the influence of any chattering component having a relatively long period which exceeds the over-count period $T_3$ of this counter. The counter 12 is provided to serve this function.

The counter 12 initiates counting the clock pulse a each time the output signal f from the gate 31 changes to its L level, and clears the count therein when the output signal f changes to its H level. Accordingly, it cannot reach its over-count when a chattering component such as the chattering component b'1 which has a relatively short period is oncoming. However, it becomes effective when a chattering component such as a next following chattering component b'2 which occurs sporadically or a chattering component having a relatively long period which exceeds the over-count period $T_3$ of the counter 13 is oncoming.

When the chattering component b'2 is oncoming, the output signal f from the gate 31 changes to its H level since the output signal c from the flipflop 21 assumes its H level. Accordingly, both the counters 11 and 13 initiate counting the clock pulse a in the manner mentioned above. The counter 13 is reset when the input signal b to be detected returns to its inherent L level which represents data component to cause the gate 31 to change its output signal f to its L level, but the counter 11 continues counting the clock pulse a. However, when the output signal f from the gate 31 changes to its L level, the counter 12 is enabled to initiate counting the clock pulse a. When the counter 12 reaches its over-count and changes its output signal h to its H level, it resets the counter 11 through the flipflop 22.

Subsequently, when the chattering component b'2 ceases and the input signal b to be detected changes to its H level in response to its inherent data content, causing the gate 31 to deliver the signal f of H level, both the counters 11 and 13 initiate counting the clock pulse a. When the counter 13 reaches its over-count, the gate 32 is enabled, and when the counter 11 subsequently reaches its over-count, its output is fed through the enabled gate 32 to trigger the flipflop 21, thus inverting the signal c. The output signal is also fed through the delay buffer 35 and the flipflop 23 to disable the gate 32, and is also fed through the delay buffer 35, the gate 33 and the flipflop 22 to reset itself. The reason herefore will be evident if one considers a failure of resetting the counter 11 by the counter 12. In this instance, the counter 11 continues counting the clock pulse a, which has been initiated in response to the presence of the chattering component b'2, and hence it reaches its over-count at an early stage to trigger the flipflop 21. As a consequence, the influence of the chattering component b'2 will be manifest upon the output signal c from the flipflop 21. Thus, in the present embodiment, the signal c from which noises are removed is obtained by eliminating the influence of a chattering component having a relatively short period (or having a stable condition of a short duration) by means of the counter 13 and eliminating the influence of a chattering component having a relatively long period by means of the counter 12. In FIG. 4, a waveform labelled "(out)" is equivalent to the signal c, and is included to indicate the effect of eliminating the noises.

It is to be understood that the over-count periods $T_3$ and $T_2$ of the counters 13 and 12, respectively, are not limited to the numerical values mentioned above, but may be chosen at will depending on the characteristic of the input signal b to be detected so as to be most appropriate to the elimination of noises such as chattering components.

It will also be appreciated that certain elements used in the second embodiment may be replaced by alternative elements or their functioning may be served by a microcomputer, generally in the similar manner as described in connection with the first embodiment.

As described, in the first embodiment, the noise elimination circuit comprises inverted output means (T-type flipflop 2) which inverts the level of an output signal in response to an inversion command signal; decision means (exclusive OR gate 3) receiving an output signal from the inverted output means and an input signal to be detected and delivering a coincidence signal when their levels coincide with each other and delivering a non-coincidence signal when their levels are different from each other; and time limit means (counter 1) for determining a length of time during which the decision means produces a non-coincidence signal and for producing an inversion command signal applied to the inverted output means when the length of time reaches a given value. Accordingly, the level of an output signal from the inverted output means cannot be changed unless the level of the input signal to be detected remains stable over a given time interval, allowing a noise removed signal to be obtained from the inverted output means from which noises fluctuating with relatively short periods are removed in a favorable manner.

In the second embodiment, a noise elimination circuit comprises inverted output means (T-type flipflop 21) for inverting the level of an output signal thereof in response to an inversion command signal; decision means (exclusive OR gate 31) receiving an output signal from the inverted output means and an input signal to be detected and producing a coincidence signal when their levels coincide with each other and producing a non-coincidence signal when their levels are different from each other; first time limit means (counter 13) for determining a length of time during which the decision means produces a non-coincidence signal and for delivering a first time-over signal when the length of time reaches a first given time interval; second time limit means (counter 12) for determining a length of time during which the decision means produces a coincidence signal and for delivering a second time-over signal when the length of time reaches a second given time interval; third time limit means (counter 11) for determining a length of time which passes after the decision means has produced a non-coincidence signal, for resetting the second time limit means whenever it delivers the second time-over signal and for delivering a third time-over signal when the length of time which is determined reaches a third given time interval; and inversion command means (AND gate 32) for producing an inversion command signal applied to the inverted output means when the first timing means delivers the first time-over signal and the third time limit means delivers the third time-over signal. Accordingly, unless the input signal to be detected exhibits a stable level which continues over the first given time interval or if the level fluctuates with a period which is greater than the second given time interval, the output signal from the inverted output means cannot change its level, whereby the inverted output means is capable of providing a signal from which noises are removed which fluctuates with relatively short periods, which occur sporadically or which fluctuates with relatively long periods.

It will be apparent from the above description of the embodiments that the both embodiments provide a noise elimination circuit which operates accurately through a digital processing of signals and which does not heavily rely upon the software.

What we claimed is:

1. A noise elimination circuit comprising
inverted output means for inverting the level of an output signal thereof in response to an inversion command signal;
decision means receiving an output signal from the inverted output means and an input signal to be detected and producing a coincidence signal when their levels coincide with each other and producing a non-coincidence signal when their levels are different from each other;
first time limit means for determining a length of time during which the decision means produces a non-coincidence signal and for delivering a first time-over signal when the length of time determined reaches a first given time interval;
second time limit means for determining a length of time during which the decision means produces a coincidence signal and for delivering a second time-over signal when the length of time determined reaches a second given time interval;
third time limit means for determining a length of time which passes after the decision means has produced a non-coincidence signal, for resetting the second time limit means whenever it delivers the second time-over signal and for delivering a third time-over signal when the length of time determined reaches a third given time interval;
and inversion command means for producing an inversion command signal applied to the inverted output means when the first time limit means delivers the first time-over signal and the third timing means delivers the third time-over signal, thereby providing a signal from which noises are moved as the output signal from the inverted output means.

2. A noise elimination circuit according to claim 1 in which the first, the second and the third time limit means each comprises a counter which counts a reference clock pulse.

3. A noise elimination circuit comprising
a non-coincidence detector circuit for detecting a non-coincidence between a previous oncoming signal which is stored and a current signal to be detected;
means responsive to an output from the non-coincidence detector circuit to determine the duration of a signal which coincides with the previous oncoming signal and for clearing the detection of an edge of the signal to be detected when the status of the signal which coincides with the previous oncoming signal continues over and exceeds a given time interval after an edge of the signal to be detected has been detected, thereby determining the status of the previous oncoming signal;
means responsive to an output from the non-coincidence detection circuit to determine that the current oncoming signal continues over a given time interval after an edge of the signal to be detected has been detected;
means responsive to an output from the non-coincidence detection circuit for determining that a given time interval has passed since the detection of an edge of the signal to be detected;
and output signal storage means for storing a signal as an oncoming signal when said means for determining the status of the oncoming signal and said means for determining the passage of a given time interval has satisfied given conditions.

* * * * *